United States Patent
Lee (10) Patent No.: US 9,362,266 B1
(45) Date of Patent: Jun. 7, 2016

(54) ELECTROSTATIC DISCHARGE PROTECTION DEVICE FOR DIFFERENTIAL SIGNAL DEVICES

(71) Applicant: Taiwan Semiconductor Manufacturing Company Limited, Hsinchu (TW)

(72) Inventor: Jam-Wem Lee, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/657,653

(22) Filed: Mar. 13, 2015

(51) Int. Cl.
| | |
|---|---|
| *H01L 29/66* | (2006.01) |
| *H01L 27/06* | (2006.01) |
| *H01L 27/02* | (2006.01) |
| *H01L 23/60* | (2006.01) |
| *H01L 29/866* | (2006.01) |
| *H01L 27/08* | (2006.01) |
| *H01L 23/528* | (2006.01) |

(52) U.S. Cl.
CPC ............ *H01L 27/0292* (2013.01); *H01L 23/60* (2013.01); *H01L 27/02* (2013.01); *H01L 27/0248* (2013.01); *H01L 27/0255* (2013.01); *H01L 29/866* (2013.01); *H01L 23/528* (2013.01); *H01L 27/0814* (2013.01)

(58) Field of Classification Search
CPC . H01L 27/02; H01L 27/0248; H01L 27/0255; H01L 27/0292; H01L 27/0814; H01L 29/866; H01L 23/60; H01L 23/528
USPC ......... 257/133, 173, 355, 491, 510, 546, 547, 257/659, E27.015, E27.019, E23.114, 257/E21.696, E29.018, E29.174, E29.211; 361/56, 91.1, 111; 438/135, 200, 234, 438/525
See application file for complete search history.

(56) References Cited

U.S. PATENT DOCUMENTS

| | | | | |
|---|---|---|---|---|
| 8,476,736 B2* | 7/2013 | Lee | ...................... | H01L 27/0255 257/547 |
| 8,610,251 B1* | 12/2013 | Salcedo | ................ | H01L 29/747 257/173 |
| 8,637,899 B2* | 1/2014 | Salcedo | .............. | H01L 27/0262 257/173 |
| 2013/0032882 A1* | 2/2013 | Salcedo | .............. | H01L 27/0262 257/355 |
| 2013/0277745 A1* | 10/2013 | Tsai | ..................... | H01L 27/0259 257/355 |
| 2015/0249078 A1* | 9/2015 | Cao | ..................... | H01L 27/0255 257/546 |

* cited by examiner

*Primary Examiner* — Dao H Nguyen
(74) *Attorney, Agent, or Firm* — Jones Day (57) ABSTRACT

A robust electrostatic (ESD) protection device is provided. In one example, the ESD protection device is configured to accommodate three nodes. When used with a differential signal device, the first and second nodes may be coupled with the differential signal device's BP and BM signal lines, respectively, and the third node may be coupled to a voltage source. This allows for a single ESD protection device to be used to protect the signal lines of the differential signal device, thus providing significant substrate area savings as compared to the conventional means of using three dual-node ESD protection devices to accomplish substantially the same protection mechanism. Moreover, the ESD protection device may be structurally designed to handle high voltage ESD events, as required by the FlexRay standard.

20 Claims, 6 Drawing Sheets

ELECTROSTATIC DISCHARGE PROTECTION DEVICE FOR DIFFERENTIAL SIGNAL DEVICES

BACKGROUND

Electrostatic discharge (ESD) is a sudden flow of electricity between electrically charged objects caused by contact, electrical short, dielectric breakdown, and others. If not properly controlled, ESD can damage the objects (e.g., integrated circuits) through which it flows and/or disrupt electrical communication signals.

Certain devices are more susceptible to ESD events due to their design and/or the environment in which they operate. For example, components in a vehicle have no electrical ground and typically operate under high temperature and low humidity, thus creating a favorable environment for electrostatic charges to accumulate. Vehicles' high susceptibility to ESD events, coupled with their increasingly complex and reliance on integrated circuits (e.g., for breaking, accelerating, turning, stability control, cruise control, etc.), make ESD protection particularly crucial in vehicle designs. As an example, the FlexRay communication standard for automobiles, developed by the FlexRay Consortium, includes specific requirements for ESD protection. For instance, inputs/outputs to the bus driver and communication controllers have to withstand voltages of up to +/−60V and pass a 6 kV HMM (Human Metal Model) ESD stress test.

A transceiver under the FlexRay standard, for example, communicates information using two differential signal lines, Bus Plus (BP) and Bus Minus (BM). More specifically, whether a bit is 0 or 1 depends on whether BP−BM is negative or positive. To protect BP and BM from ESD events, it is conventional to use three ESD protection devices, each of which has two nodes. A typical configuration places a first ESD protection device between BP and Vss (negative supply voltage), a second ESD protection device between BM and Vss, and a third ESD protection device between BP and BM. The three dual-node ESD protection devices take up considerable real estate on a substrate, which in undesirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
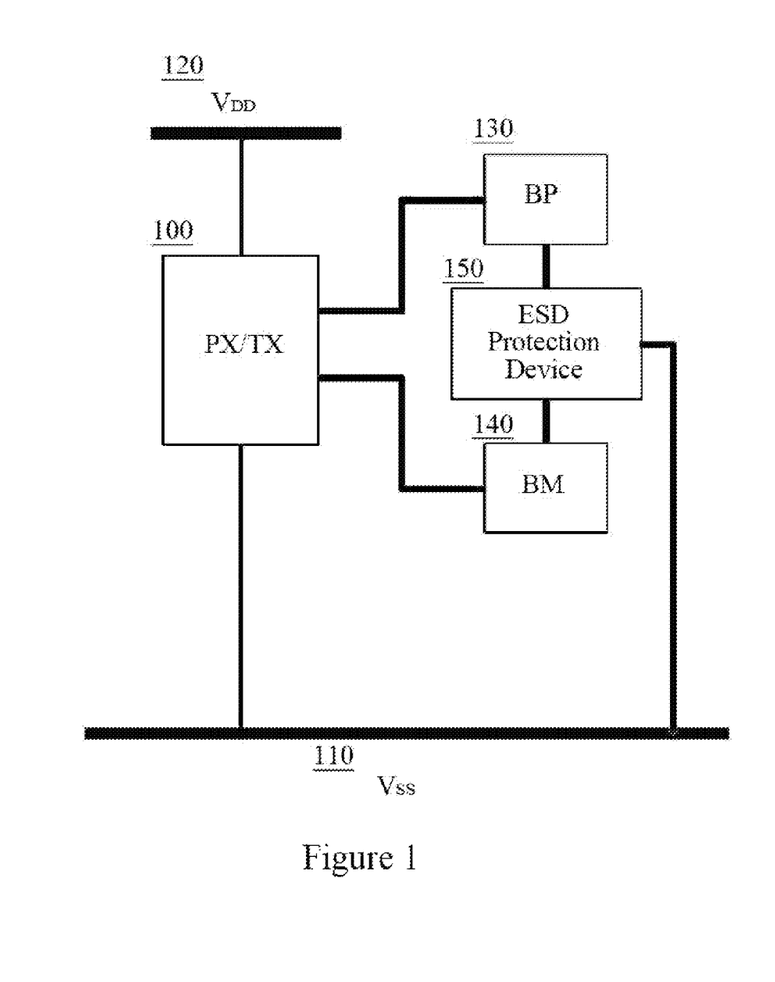
FIG. 1 is a block diagram showing a configuration of a three-node ESD protection device protecting the signal lines of a differential signal transceiver, in accordance with some embodiments.

In one embodiment, a three-node ESD protection device sufficiently robust to handle high ESD currents is provided. FIG. 1 is a block diagram depicting an exemplary configuration where such a three-node ESD protection device is used to protect the signal lines of a differential signal transceiver. The differential signal transceiver 100, which may be a receiver (RX) or transmitter (TX), is electrically coupled to a source voltage 110 (i.e., $V_{SS}$) and a drain voltage 120 (i.e., $V_{DD}$). The transceiver 100 includes two signal lines, BP 130 and BM 140 (the differential value of which determines whether a signal is a 0 or a 1). As described above, the conventional method of protecting BP and BM from ESD uses three dual-node ESD protection devices: a first dual-node ESD protection device is positioned between BP and BM, a second dual-node device is positioned between BP and $V_{SS}$, and a third dual-node device is positioned between BM and $V_{SS}$. In contrast to this conventional configuration, the embodiment depicted in FIG. 1 shows the use of a single three-node ESD protection device 150 to achieve substantially the same ESD protection for BP 130 and BM 140. Specifically, the three nodes of the ESD protection device 150 are connected to BP 130, BM 140, and $V_{SS}$ 110. This configuration allows the single ESD protection device 150 to protect BP 130 and BM 140 against ESD events (a function conventionally served by the first dual-node ESD protection device mentioned above), between BP 130 and $V_{SS}$ 110 (a function conventionally served by the second dual-node ESD protection device), and between BM 140 and $V_{SS}$ 110 (a function conventionally served by the third dual-node ESD protection device). By using only one three-node ESD protection device 150 to achieve the same ESD protection conventionally provided by three dual-node ESD protection devices, significant substrate area savings may be realized. It is observed that the area required by the three-node ESD protection device 150 is roughly 50% less than the combined area required by the three conventional dual-node ESD protection devices.

Figure 2:
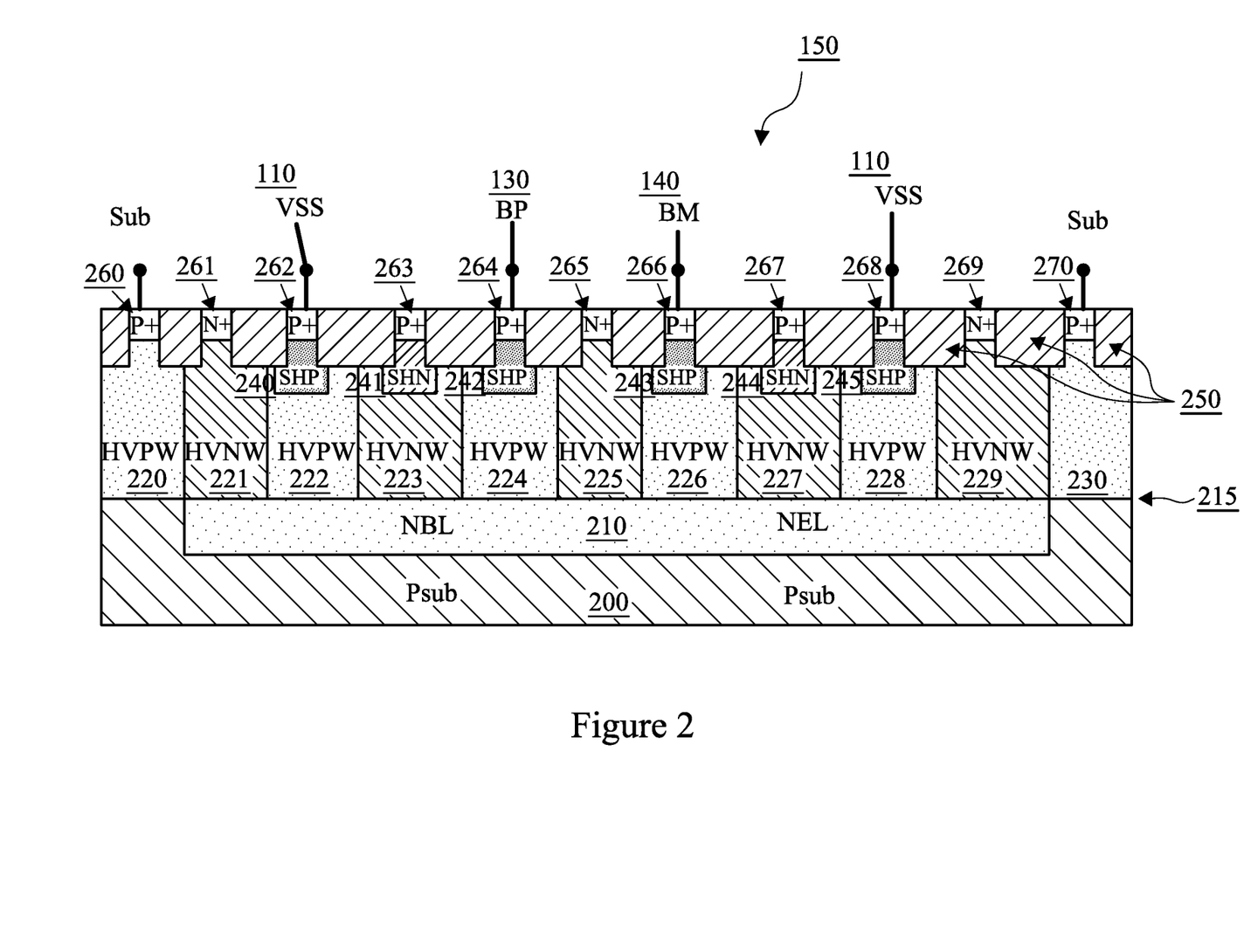
FIG. 2 is a cross-sectional view of an ESD protection device, in accordance with some embodiments.

FIG. 2 illustrates a cross-sectional view of a three-node ESD protection device 150 according to an embodiment. The shown device 150 may be a portion of an integrated circuit device; the remaining portion of which is not shown. In this embodiment, the ESD protection device 150 is formed on a substrate 200 (e.g., a semiconductor material such as silicon) lightly doped with a P-type impurity (i.e., the substrate 200 has a conductivity type of P-type). An N-type Buried Layer (NBL) 210 is formed over a top surface of the P-type substrate 200 such that the NBL's 210 bottom surface and two sides are in contact with the P-type substrate 200. The NBL 210 may be formed by, e.g., implanting an N-type impurity into the P-type substrate 200. The P-type substrate 200 and NBL 210 effectively form a surface 215 with a middle NBL 210 region, flanked by P-type substrate 200 regions.

High-voltage well regions are then formed on the surface 215. FIG. 2 shows a row of high-voltage well regions with alternating conductivity types. High-voltage P-type wells (HVPW) 220 230 are formed above and in contact with portions of the surface 215 formed by the P-type substrate 200. Between the HVPW 220 and HVPW 230 are high-voltage well regions with alternating conductivity types, formed above and in contact with the portion of the surface 215 formed by the NBL 210. Specifically, FIG. 2 shows an exemplary embodiment with a high-voltage N-type well (HVNW) 221, adjoined by HVPW 222, adjoined by HVNW 223, adjoined by HVPW 224, adjoined by HVNW 225, adjoined by HVPW 226, adjoined by HVNW 227, adjoined by HVPW 228, adjoined by HVNW 229. In some implementations, these high-voltage well regions may be formed by growing an epitaxial layer above the surface 215, and implanting the epitaxial layer with the desired dopants to form the desired P-type and N-type regions.

Shallow well regions—i.e., shallow P-type regions (SHP) or shallow N-type regions (SHN)—are then formed on select high-voltage well regions. In the example shown in FIG. 2, SHP regions 240, 242, 243, 245 are formed above and in contact with, respectively, the four HVPW regions 222, 224, 226, 228 above the NBL 210. SHN regions 241 and 244 are formed above and in contact with HVNW regions 223 and 227, respectively. In some implementations, the doping concentrations of the shallow well regions are greater than doping concentrations of the underlying high-voltage well regions. In some implementations, each shallow well region's bottom surface extends below the top surface of the associated high-voltage well region.

Heavily doped regions, either P-type (P+) or N-type (N+), are then formed. As show in FIG. 2, in one embodiment separate P+ regions (i.e., 262, 263, 264, 266, 267, and 268) are formed above and in contact with each of the shallow well regions (i.e., 240-245). In addition, separate P+ regions (i.e., 260 and 270) are formed above the HVPW regions directly above and in contact with the P-type substrate 200 (i.e., 220 and 230). N+ regions (i.e., 261, 265, and 269) are formed above and in contact with the HVNW regions that do not have shallow well regions (i.e., 221, 225, and 229). This process in some implementations may be performed by implanting P-type or N-type impurities into an epitaxial layer or substrate.

In the embodiment depicted in FIG. 2, isolation regions 250 are formed using, e.g., shallow trench isolation (STI). The STI regions 250 may be formed by etching the epitaxial layer or substrate used to form the high-voltage well regions, shallow well regions, and heavily doped regions, and filling the resulting recess with dielectric materials. The STI regions isolate the heavily doped regions (i.e., 260-270) such that the side surfaces of each heavily doped region is in contact with the STI regions, and the bottom surface of each heavily doped region is in contact with the associated shallow well region or high-voltage well region on which the heavily doped region is formed.

As described above, the ESD protection device 150 supports at least three nodes. In the exemplary embodiment depicted by FIG. 2, a first node electrically couples $V_{SS}$ 110 to the two outer P+ regions 262 and 268 formed over SHP regions. In between those P+ regions 262 and 268 are two additional P+ regions 264 and 266 formed over SHP regions. In the depicted embodiment, a second node couples a differential signal device's BP signal line 130 to P+ 264, and a third node couples the differential signal device's BM signal line 140 to P+ 266. In another exemplary embodiment (not shown), BP 130 is coupled to P+ 266, and BM 140 is coupled to P+ 264.

It is noted that while FIG. 2 depicts an embodiment of an ESD protection device 150 formed on a P-type substrate, one skilled in the art would recognize that an N-type substrate may be used instead. In embodiments where N-type substrate is used, the conductivity types of the buried layer, high-voltage well regions, shallow well regions, and heavily doped regions, as described herein with respect to FIG. 2, are inverted. For example, rather than having the N-type Buried Layer shown in FIG. 2, an embodiment using an N-type substrate would have a P-type Buried Layer.

The structure of the multi-node ESD protection device 150, such as the one depicted in FIG. 2, provides sufficient current channels to protect against high-level ESD events as those specified by the FlexRay standard (i.e., voltages of up to +/−60V and pass a 6 kV HMM (Human Metal Model) stress test). For example, when an ESD event causes BP 130 to have a positive voltage with respect to $V_{SS}$, electrons would flow from the nearest $V_{SS}$ (i.e., via 262) to BP 130. Electrons would also flow from the other $V_{SS}$ terminal (i.e., via 268) to BP 130, but due to the relatively higher resistance (due to the longer distance), less current would be flowing through that path. Similarly, if an ESD event causes BM 140 to have a positive voltage with respect to $V_{SS}$, current would flow from the closer $V_{SS}$ terminal (i.e., via 268) to BM 140, and to a lesser extent from the other $V_{SS}$ terminal (i.e., via 262) to BM 140. In the event an ESD event causes BP 130 to have a positive voltage with respect to BM 140, current would flow from BM 140 to BP 130. If the relative voltage between BP 130 and BM 140 is reversed, then the current would instead flow from BP 130 to BM 140. The structure shown in FIG. 2 minimizes the flow path length, and therefore resistance, between the signal lines BP 130 and BM 140 and their respective distance to $V_{SS}$ 110 (via 262 and 268). Specifically, the HVPW 224 associated with BP 130 is separated by the width of a single HVNW region from each of the HVPW 222 associate with $V_{SS}$ 110 and the HVPW 226 associated with BM 140; similarly, the HVPW 226 associated with BM 140 is separated by the width of a single HVNW region from each of the HVPW 228 associated with $V_{SS}$ 110 and the HVPW 224 associated with BP 130.

Figure 3A:
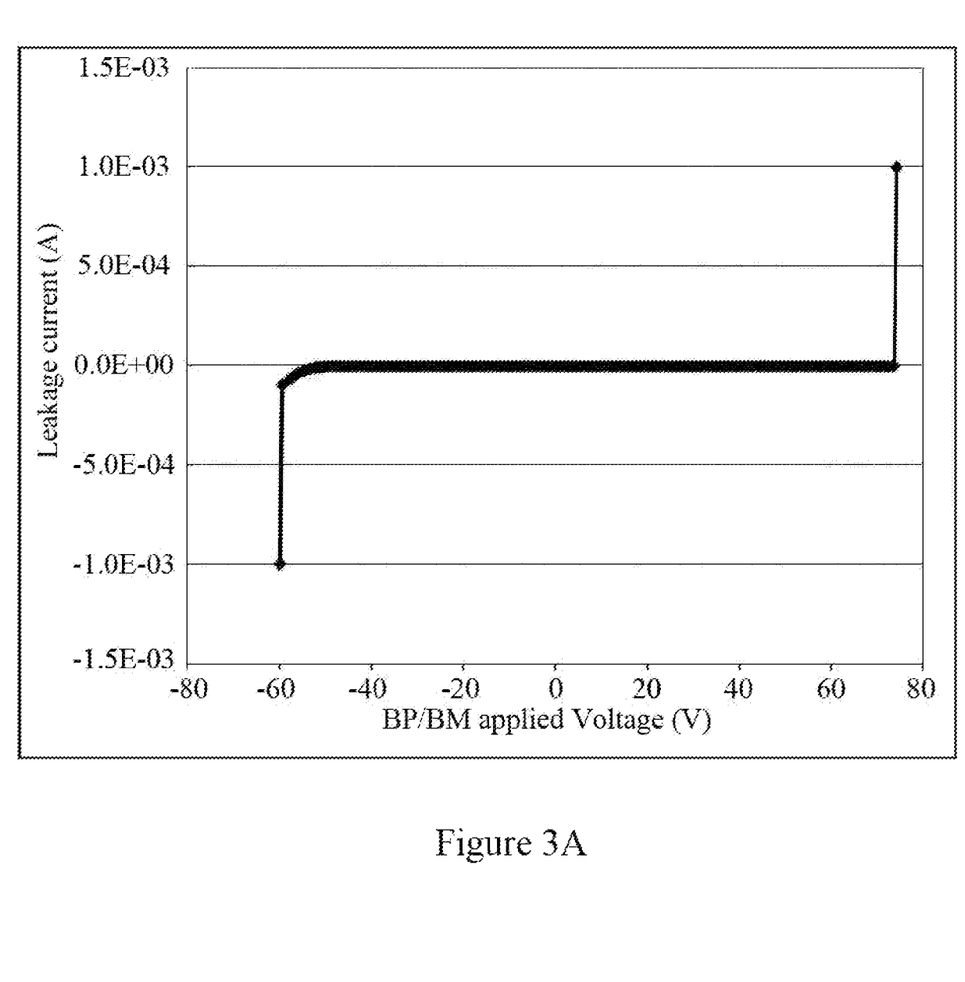
FIGS. 3A and 3B are graphs of experimental results showing current leakage at various applied voltages, in accordance with some embodiments.
Figure 3B:
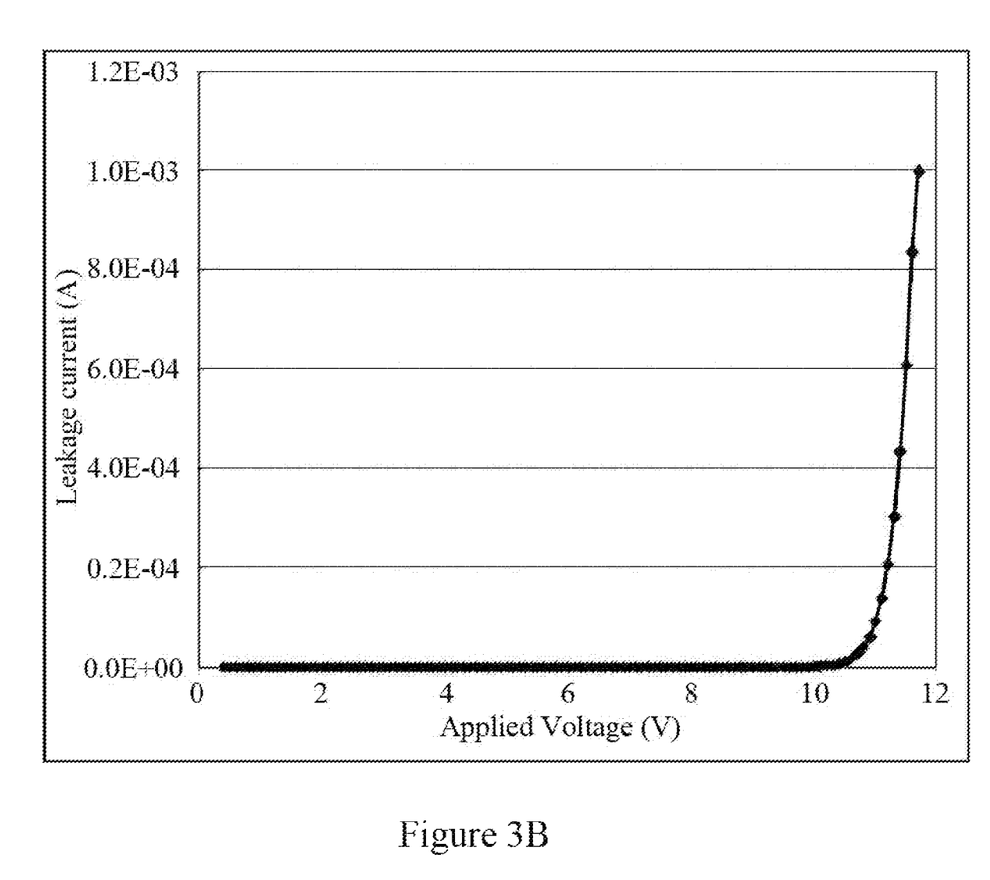

FIGS. 3A and 3B illustrate current leakage test results using the ESD protection device 150. FIG. 3A shows current leakage resulting from simulated ESD events ranging from −60V to +60V being applied to BP or BM, with respect to $V_{SS}$. As shown by FIG. 3A, the current leakage remains substantially at 0 A within the +/−60V range, which satisfies the FlexRay standard. FIG. 3B shows current leakage resulting from simulated ESD events from 0 to close to 12V being applied to BM with respect to BP. The current leakage remains substantially at 0 A when the applied voltage is between 0V to roughly 10V, and then increases substantially at higher voltages. Since the magnitude of an ESD across BM and BP is typically much smaller (typically less than 5V) than an ESD involving VSS, this result would satisfy the performance requirements of FlexRay.

Figure 4A:
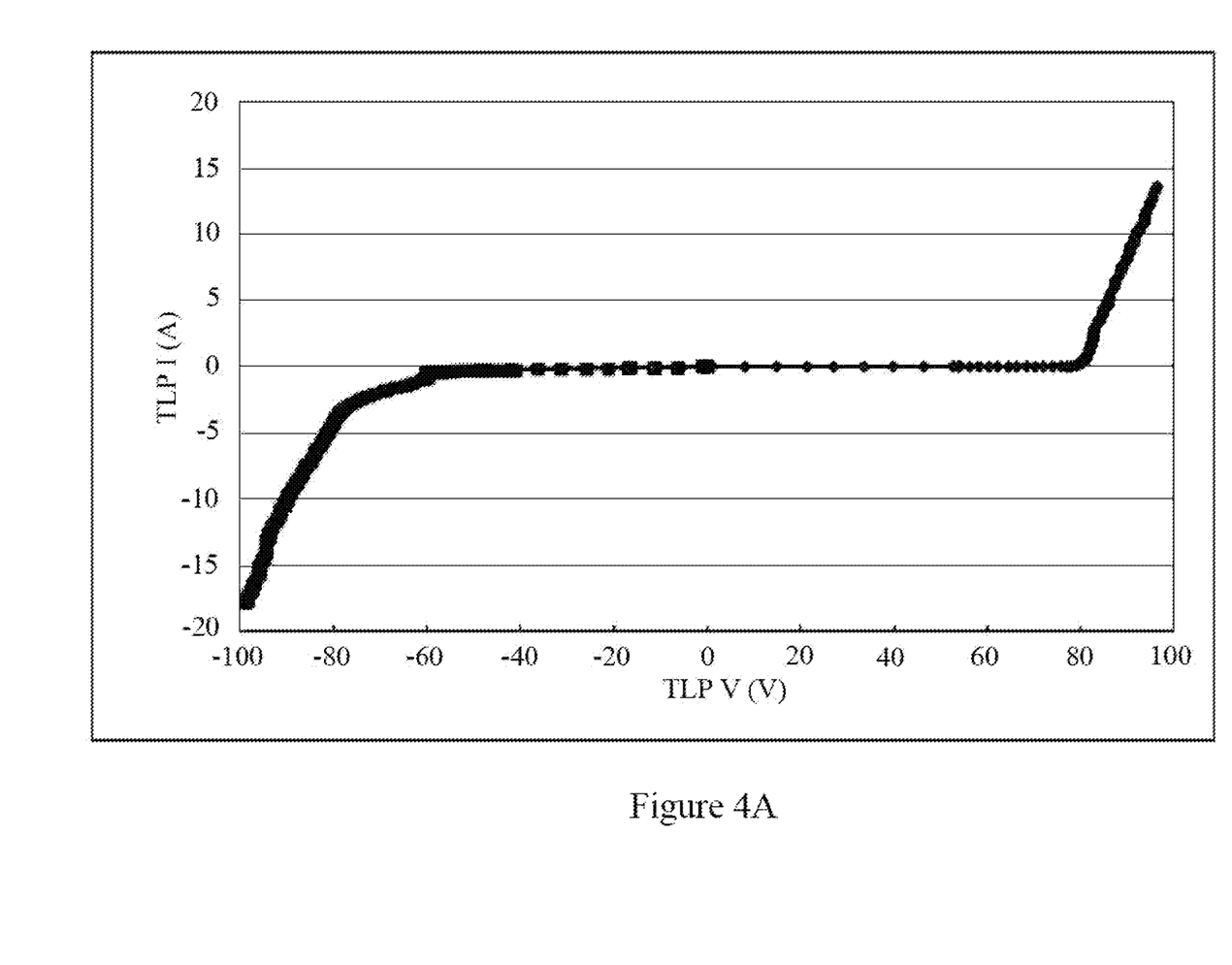
FIGS. 4A and 4B are graphs of experimental results showing transmission line pulse at various applied voltages, in accordance with some embodiments.
Figure 4B:
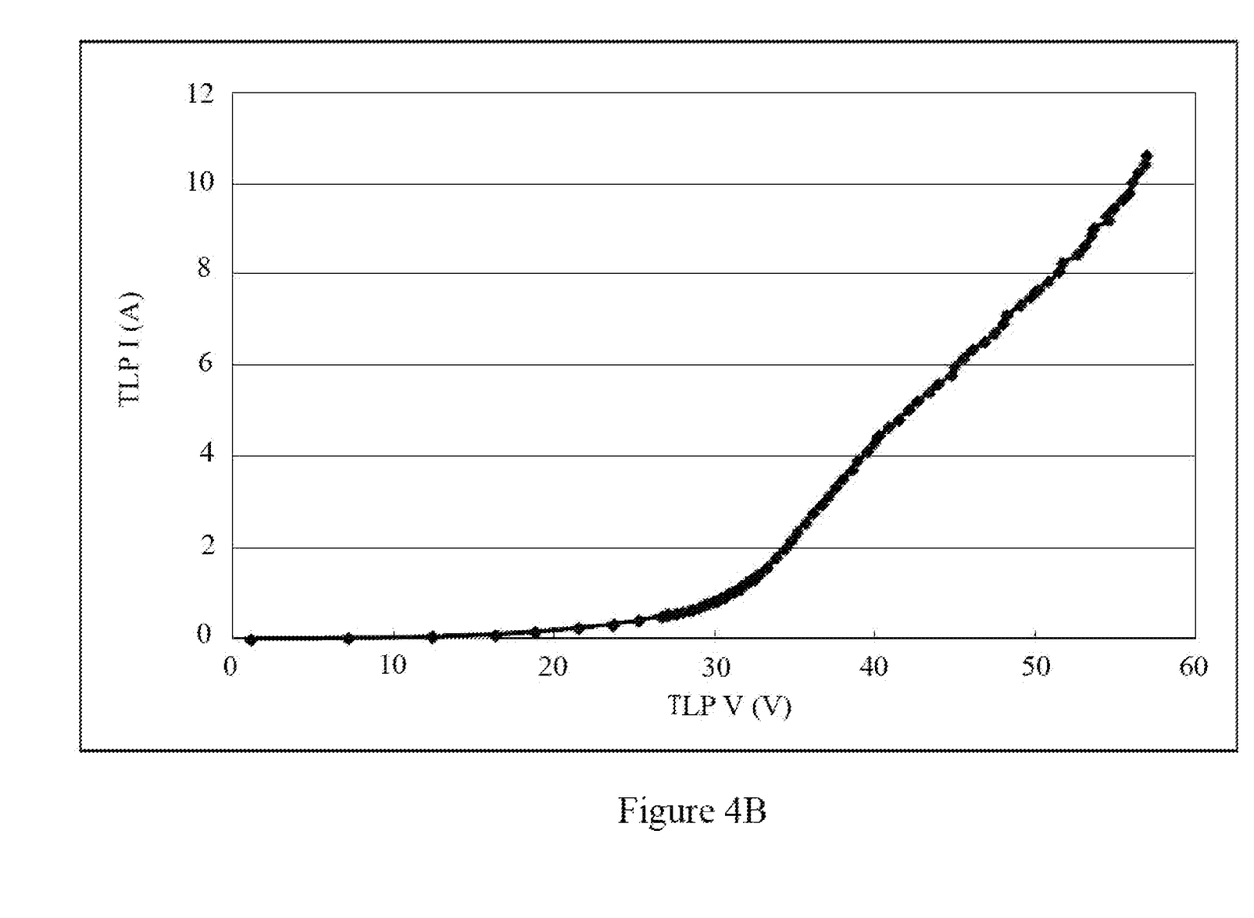

FIGS. 4A and 4B illustrate transmission line pulse (TLP) test results using the ESD protection device 150. FIG. 4A shows measures of TLP current when a simulated ESD event ranging from −60V to +60V is applied to BP or BM, with respect to $V_{SS}$. Again, the TLP line current remains substantially 0 A within the +/−60V range of the simulated ESD event. FIG. 4A shows measures of TLP current when a simulated ESD event ranging from 0V to roughly 60V is applied to BP with respect to BM. Here, it is observed that the TLP line current remains substantially 0 A until the applied voltage reaches roughly 15V. This result again shows that the ESD protection device 150 provides sufficiently robust protection against expected ESD behavior, which is typically less than 5V between BP and BM.

As demonstrated by FIGS. 3A-3B and 4A-4B, the three-node ESD protection device provides sufficient ESD protection for differential signal devices (e.g., transceivers) to satisfy the stringent requirements of the FlexRay standard. The structure of the three-node ESD protection device allows a single ESD protection device to protect the BP and BM signal lines of a transceiver. Compared to the conventional use of three dual-node ESD protection devices to accomplish the same task, the single three-node ESD protection device described herein provides substantial area savings. It is observed that in some implementations the area of a single three-node ESD protection device has an area saving of roughly 50% compared to the area occupied by three dual-node ESD protection devices. Furthermore, the structure of the three-node ESD protection device minimizes the distances, and therefore resistance, between the three nodes to ensure efficient current flow.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Described herein is an embodiment of an electrostatic discharge protection device for differential signal devices. The ESD protection device includes a substrate of a first conductivity type (e.g., P-type). A buried layer material of a second conductivity type (e.g., N-type) is formed over and in contact with a surface of the substrate. A first, second, third, and fourth high-voltage wells of the first conductivity type is formed over and in contact with a surface of the buried layer material. A first, second, third, and fourth shallow well regions of the first conductivity type is formed over and in contact with the first, second, third, and fourth high-voltage wells of the first conductivity type, respectively. A first, second, third, and fourth doped regions of the first conductivity type is formed over and in contact with the first, second, third, and fourth shallow well regions, respectively. A first, second, and third high-voltage wells of the second conductivity type is formed over and in contact with the surface of the buried layer material. The first high-voltage well of the second conductivity type is between and in contact with the first and the second high-voltage wells of the first conductivity type, the second high-voltage well of the second conductivity type is between and in contact with the second and the third high-voltage wells of the first conductivity type, and the third high-voltage well of the second conductivity type is between and in contact with the third and the fourth high-voltage wells of the first conductivity type. The first and fourth doped regions of the first conductivity type are connected to a voltage supply, the second doped region of the first conductivity type is connected to a first signal line of a differential data bus, and the third doped region of the first conductivity type is connected to a second signal line of the differential data bus.

In one embodiment, an electrostatic discharge protection device for differential signal devices is provided. The electrostatic discharge protection device has a first node connected to a first signal line of a differential signal device, a second node connected to a second signal line of the differential signal device, and a third node connected to a voltage supply of the differential signal device. The first node, second node, and third node are electrically coupled to regions of a substrate, which are configured to allow electric current to flow from any one of the first node, the second node, and the third node to at least one of the other two nodes.

In another embodiment, an electrostatic discharge protection device is provide. The device has a first, second, third, and fourth high-voltage wells of a first conductivity type formed on a substrate, wherein the second and the third high-voltage wells are positioned between the first and the fourth high-voltage wells. The device also has a first node electrically coupled to the first and the fourth high-voltage wells, second node electrically coupled to the second high-voltage well, and a third node electrically coupled to the third high-voltage well. The first, the second, the third, and the fourth high-voltage wells are configured to allow electric current to flow from any one of the first node, the second node, and the third node to at least one of the other two nodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge protection device for differential signal devices, comprising:
   a substrate of a first conductivity type;
   a buried layer material of a second conductivity type, formed over and in contact with a surface of the substrate;
   a first, second, third, and fourth high-voltage wells of the first conductivity type, formed over and in contact with a surface of the buried layer material;
   a first, second, third, and fourth shallow well regions of the first conductivity type, formed over and in contact with the first, second, third, and fourth high-voltage wells of the first conductivity type, respectively;
   a first, second, third, and fourth doped regions of the first conductivity type, formed over and in contact with the first, second, third, and fourth shallow well regions, respectively;
   a first, second, and third high-voltage wells of the second conductivity type, formed over and in contact with the surface of the buried layer material, wherein the first high-voltage well of the second conductivity type is between and in contact with the first and the second high-voltage wells of the first conductivity type, the second high-voltage well of the second conductivity type is between and in contact with the second and the third high-voltage wells of the first conductivity type, and the third high-voltage well of the second conductivity type is between and in contact with the third and the fourth high-voltage wells of the first conductivity type;
   wherein the first and fourth doped regions of the first conductivity type are connected to a voltage supply;
   wherein the second doped region of the first conductivity type is connected to a first signal line of a differential data bus; and wherein the third doped region of the first conductivity type is connected to a second signal line of the differential data bus.

2. The electrostatic discharge protection device of claim 1, wherein the second and the third doped regions are positioned between the first and the fourth doped regions.

3. The electrostatic discharge protection device of claim 1, wherein the first conductivity type is P-type and the second conductivity type is N-type.

4. The electrostatic discharge protection device of claim 1, wherein the voltage supply is Vss.

5. The electrostatic discharge protection device of claim 1, wherein the first signal line and the second signal line carry signals of opposite polarities.

6. The electrostatic discharge protection device of claim 1, wherein the differential data bus adheres to the FlexRay standard.

7. The electrostatic discharge protection device of claim 1, wherein the differential data bus is coupled to a transceiver.

8. An electrostatic discharge protection device for differential signal devices, comprising:
    a first node connected to a first signal line of a differential signal device;
    a second node connected to a second signal line of the differential signal device;
    a third node connected to a voltage supply of the differential signal device;
    wherein the first node, second node, and third node are electrically coupled to regions of a substrate;
    wherein the regions of the substrate are configured to allow electric current to flow from any one of the first node, the second node, and the third node to at least one of the other two nodes.

9. The electrostatic discharge protection device of claim 8, wherein the differential signal device is a FlexRay transceiver.

10. The electrostatic discharge protection device of claim 8, wherein the first signal line is a bus plus and the second signal line is a bus minus, wherein the differential signal device is configured to use a first signal on the bus plus and a second signal on the bus minus to determine a digital signal value.

11. The electrostatic discharge protection device of claim 8, wherein the voltage supply is Vss.

12. The electrostatic discharge protection device of claim 8, wherein the regions of the substrate are doped with impurities of a first conductivity type.

13. The electrostatic discharge protection device of claim 8, wherein the regions are formed above and in contact with high-voltage wells of a first conductivity type.

14. The electrostatic discharge protection device of claim 8, wherein the substrate includes a first region, a second region, a third region, and a four region having substantially equal impurity concentration of a conductivity type, wherein the second region and third region are between the first region and the fourth region, wherein the third node is electrically coupled to the first region and the fourth region, wherein the first node is electrically coupled to the second region, and wherein the second node is electrically coupled to the third region.

15. An electrostatic discharge protection device, comprising:
    a first, second, third, and fourth high-voltage wells of a first conductivity type formed on a substrate, wherein the second and the third high-voltage wells are positioned between the first and the fourth high-voltage wells;
    a first node electrically coupled to the first and the fourth high-voltage wells;
    a second node electrically coupled to the second high-voltage well;
    a third node electrically coupled to the third high-voltage well;
    wherein the first, the second, the third, and the fourth high-voltage wells are configured to allow electric current to flow from any one of the first node, the second node, and the third node to at least one of the other two nodes.

16. The electrostatic discharge protection device of claim 15, wherein the first, the second, the third, and the fourth high-voltage wells of the first conductivity type are separated by high-voltage wells of a second conductivity type.

17. The electrostatic discharge protection device of claim 16, wherein the first conductivity type is P-type and the second conductivity type if N-type.

18. The electrostatic discharge protection device of claim 15, wherein the first node is connected to a doped region of the first conductivity type, wherein the doped region is formed above and in contact with a shallow well region of the first conductivity type, wherein the shallow well region is formed above and in contact with the first high-voltage well.

19. The electrostatic discharge protection device of claim 15, wherein the first node is connected to a voltage supply of a differential signal device, wherein the second node is connected to a first signal line of the differential signal device; and wherein the third node is connected to a second signal line of the differential signal device.

20. The electrostatic discharge protection device of claim 19, wherein the differential signal device is configured to use a first signal on the first signal line and a second signal on the second signal line to determine a digital signal value.

* * * * *